United States Patent
Someya et al.

(10) Patent No.: US 11,428,892 B2
(45) Date of Patent: Aug. 30, 2022

(54) OPTICAL APPARATUS

(71) Applicant: Gigaphoton Inc., Tochigi (JP)

(72) Inventors: Hiroshi Someya, Oyama (JP); Yukio Watanabe, Oyama (JP)

(73) Assignee: Gigaphoton Inc., Tochigi (JP)

( * ) Notice: Subject to any disclaimer, the term of this patent is extended or adjusted under 35 U.S.C. 154(b) by 71 days.

(21) Appl. No.: 17/003,284

(22) Filed: Aug. 26, 2020

(65) Prior Publication Data
US 2021/0103118 A1   Apr. 8, 2021

(30) Foreign Application Priority Data

Oct. 3, 2019  (JP) .............................. JP2019-183244

(51) Int. Cl.
*G03F 7/20* (2006.01)
*G02B 7/02* (2021.01)

(52) U.S. Cl.
CPC ......... *G02B 7/023* (2013.01); *G03F 7/70825* (2013.01); *G03F 7/70833* (2013.01); *G03F 7/70975* (2013.01)

(58) Field of Classification Search
CPC ............ G03F 7/70033; G03F 7/70141; G03F 7/70175; G03F 7/70825; G03F 7/70833; G03F 7/70975; G03F 7/708; G03F 7/70808; G03F 7/70841; G03F 7/70858; G03F 7/70883; G03F 7/709; G03F 7/70908; G03F 7/70991; G02B 7/00; G02B 7/003; G02B 7/005; G02B 7/02; G02B 7/022;

(Continued)

(56) References Cited

U.S. PATENT DOCUMENTS 9,198,273 B2   11/2015 Igarashi et al.
2013/0114215 A1*  5/2013 Kawasuji ................. G02B 7/00
                                                361/728

(Continued)

FOREIGN PATENT DOCUMENTS

DE       102008044365 A1 *  6/2009 ......... G03F 7/70825
DE   10 2013 200 368 A1      7/2014

(Continued)

OTHER PUBLICATIONS

A Dutch Search Report issued by the Netherlands Patent Office dated Mar. 25, 2021, which corresponds to Dutch Patent Application No. 2026304 and is related to U.S. Appl. No. 17/003,284 with partial English translation.

*Primary Examiner* — Christina A Riddle
(74) *Attorney, Agent, or Firm* — Studebaker & Brackett PC

(57) ABSTRACT

An optical apparatus may include a housing having an opened front face, an optical unit freely movable into and out of an internal space of the housing through the front face, and a positioning portion disposed on a back side of the optical unit in the internal space. A base plate of the optical unit may include first and second convex portions disposed on a base end face of the base plate. The second convex portion may be disposed at a position different from the first convex portion in a width direction of the base plate. The positioning portion may include a V block having a V groove shape at a part contacting the first convex portion, and a flat block having a flat surface shape at a part contacting the second convex portion. The optical unit may be positioned in the internal space through the contact.

2 Claims, 10 Drawing Sheets

(58) Field of Classification Search
CPC . G02B 7/023; G02B 7/14; G02B 7/18; G02B
7/1805; G02B 7/182; G02B 7/1822;
G02B 7/1827; G02B 7/192; G02B 7/198;
H05G 2/00; H05G 2/001; H05G 2/008
USPC ....... 359/811, 809, 813, 841, 819, 821, 822,
359/827, 828–830; 355/30, 52–55,
355/67–71, 77; 250/492.1, 492.2, 493.1,
250/503.1, 504 R
See application file for complete search history.

(56) References Cited

U.S. PATENT DOCUMENTS

2019/0113765 A1    4/2019  Nagahama et al.
2019/0320521 A1   10/2019  Takayama

FOREIGN PATENT DOCUMENTS

| DE | 102013200368 A1 | * | 7/2014 | ........... G02B 7/1827 |
| EP | 1 406 107 A2 | | 4/2004 | |
| JP | H08-153665 A | | 6/1996 | |
| WO | WO-2018011953 A1 | * | 1/2018 | ........... G02B 27/141 |
| WO | 2018/150530 A1 | | 8/2018 | |

* cited by examiner

OPTICAL APPARATUS

CROSS-REFERENCE TO RELATED APPLICATIONS

The present application claims the benefit of Japanese Patent Application No. 2019-183244, filed on Oct. 3, 2019, the entire contents of which are hereby incorporated by reference.

BACKGROUND

1. Technical Field

The present disclosure relates to an optical apparatus.

2. Related Art

Recently, miniaturization of a transfer pattern in optical lithography of a semiconductor process has been rapidly proceeding along with miniaturization of the semiconductor process. Minute fabrication at 10 nm or smaller will be requested in the next generation technology. To meet the request for minute fabrication at 10 nm or smaller, for example, it is desired to develop a semiconductor exposure device including an extreme ultraviolet light generation apparatus configured to generate extreme ultraviolet (EUV) light at a wavelength of 13 nm approximately in combination with reduced projection reflective optics.

EUV light generation devices being developed include a laser produced plasma (LPP) device that uses plasma generated by irradiating a target material with a pulse laser beam.

LIST OF DOCUMENTS

Patent Documents

Patent Document 1: International Publication No. WO 2018/150530
Patent Document 2: US Patent Application Publication No. 2019/0113765
Patent Document 3: Japanese Unexamined Patent Application Publication No. 8-153665
Patent Document 4: U.S. Pat. No. 9,198,273

SUMMARY

An optical apparatus according to an aspect of the present disclosure may include a housing having an opened front face; an optical unit including an optical instrument and a base plate and freely movable into and out of an internal space of the housing through the front face of the housing, the optical instrument being fixed to the base plate; and a positioning portion disposed on a back side of the optical unit in the internal space of the housing, the back side being defined to be a side toward which the optical unit is pulled out in a movement direction of the optical unit. The base plate may include a first convex portion disposed on a base end face of the base plate on the back side, and a second convex portion disposed on the base end face of the base plate. The second convex portion may be disposed at a position different from the first convex portion in a width direction of the base plate, which is orthogonal to a movement direction. The positioning portion may include a V block having a V groove shape in a horizontal cross-section at a part contacting the first convex portion, the V block contacting the first convex portion at two places; and a flat block having a flat surface shape in a horizontal cross-section at a part contacting the second convex portion. The optical unit may be positioned in the internal space of the housing through the contact between the first convex portion and the V block and the contact between the second convex portion and the flat block.

BRIEF DESCRIPTION OF THE DRAWINGS

Embodiments of the present disclosure will be described below as examples with reference to the accompanying drawings.

DESCRIPTION OF EMBODIMENTS

1. Overview
2. Description of Optical Apparatus of Comparative Example
  2.1 Configuration
  2.2 Operation
  2.3 Problem
3. Description of Optical Apparatus of Embodiment 1
  3.1 Configuration
  3.2 Operation
  3.3 Effect
4. Description of Optical Apparatus of Embodiment 2
  4.1 Configuration
  4.2 Effect
5. Description of Optical Apparatus of Embodiment 3
  5.1 Configuration
  5.2 Effect Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overview

Embodiments of the present disclosure relate to an optical apparatus disposed between a laser apparatus (not illustrated) and an amplification module or an extreme ultraviolet light generation apparatus (not illustrated). The laser apparatus emits a laser beam. The optical apparatus emits the laser beam from the laser apparatus toward the amplification module or the extreme ultraviolet light generation apparatus. The amplification module amplifies the laser beam from the optical apparatus. The amplification module may emit the amplified laser beam toward the extreme ultraviolet light generation apparatus. The extreme ultraviolet light generation apparatus generates light having a wavelength corresponding to what is called extreme ultraviolet (EUV), from the laser beam from the optical apparatus or the amplification module.

2. Description of Optical Apparatus of Comparative Example 2.1 Configuration

Figure 1:
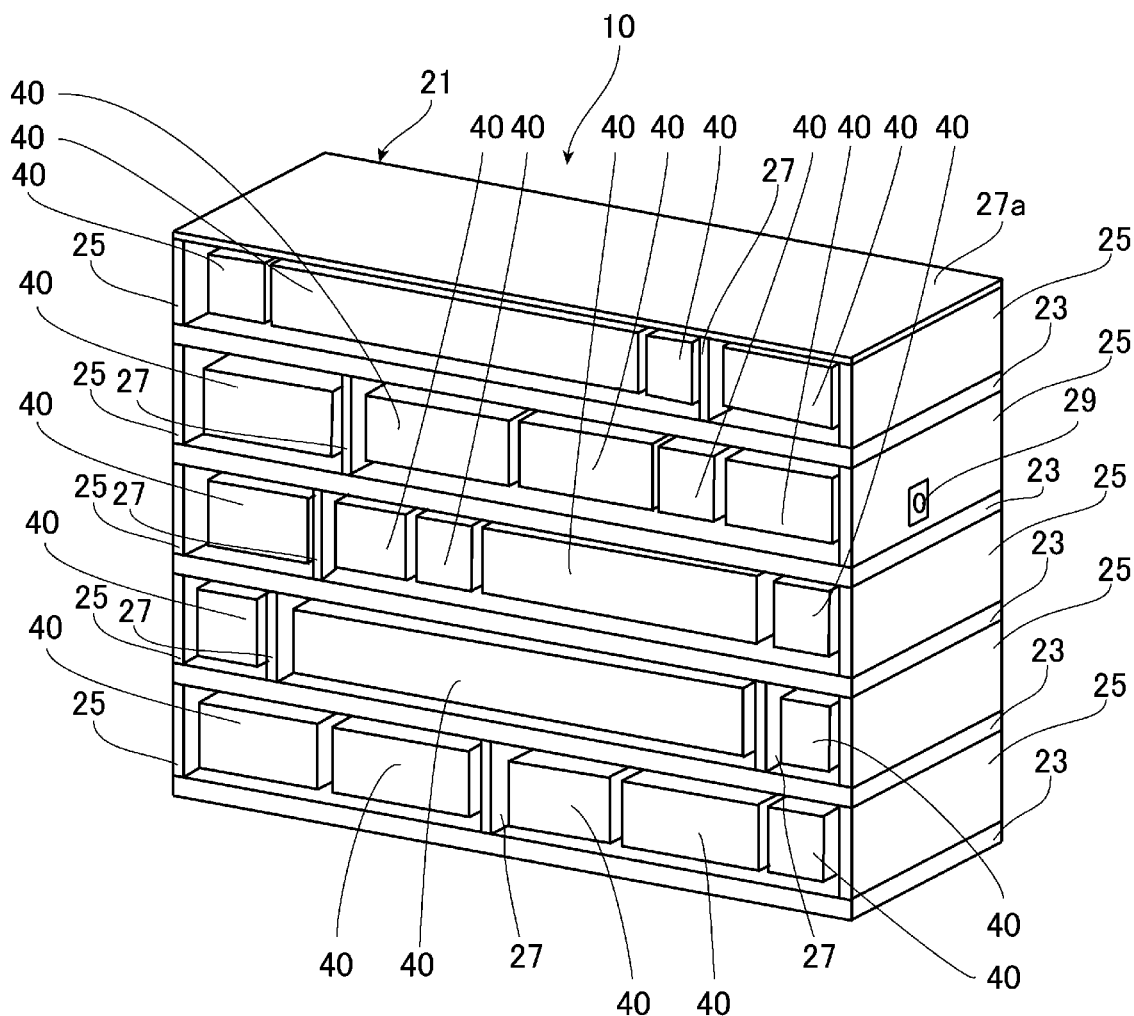
FIG. 1 is a diagram illustrating an exemplary entire schematic configuration of an optical apparatus.
Figure 1:
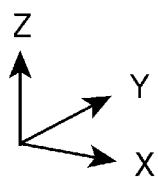

The following describes an optical apparatus 10 of a comparative example. FIG. 1 is a diagram illustrating an exemplary entire schematic configuration of the optical apparatus 10 of the present example. The optical apparatus 10 includes a housing 21 having an opened front face, and a plurality of optical units 40. FIG. 1 illustrates the optical units 40 in a simplified manner for clear illustration.

For the purpose of illustration, a Z axial direction is defined to be the height direction of the optical apparatus 10, an X axial direction is defined to be a direction orthogonal to the Z axial direction, and a Y axial direction is defined to be a direction orthogonal to the Z axial direction and the X axial direction. The Y axial direction extends from the opened front face of the housing 21 of the optical apparatus 10 toward a back face of the housing 21. A movement direction of each optical unit 40 is defined to be along the Y axial direction and a direction opposite to the Y axial direction. A back side is defined to be a side toward which the optical unit 40 is pulled out, in other words, the opened front face side in the movement direction of the optical unit 40. A front side is defined to be a side toward the optical unit 40 is pressed in, in other words, the back face side in the movement direction of the optical unit 40.

The housing 21 is divided into five layers in the Z axial direction. Each layer includes a frame 23 disposed along an XY plane, and a pair of sidewalls 25 each disposed along a YZ plane on the frame 23. For example, in the second layer from the top, a light incidence portion (not illustrated) on which a laser beam from the laser apparatus (not illustrated) is incident is disposed on the sidewall 25 on the left side in the drawing. In addition, in the second layer from the top, a light emission portion 29 through which the laser beam is emitted to the amplification module or EUV light generation apparatus (not illustrated) is disposed on the sidewall 25 on the right side in the drawing. Each layer is divided into two or three rooms by a plate material 27 disposed along a YZ plane. A plate material 27a as a top plate is disposed on the first layer from the top. The frame 23, the sidewalls 25, the plate material 27, and the plate material 27a are made of, for example, metal such as stainless steel or aluminum. The number of layers and the number of rooms are not particularly limited. The positions of the light incidence portion and the light emission portion 29 are not particularly limited.

In the present embodiment, at least one optical unit 40 is disposed in one room. When a plurality of optical units 40 are disposed in one room, optical instruments 41 of the respective optical units 40 to be described later are optically connected with each other in the room. When two optical units 40 are disposed in two adjacent rooms, respectively, the optical instrument 41 of the optical unit 40 disposed in one of the rooms is optically connected with the optical instrument 41 of the optical unit 40 disposed in the other room through a hole (not illustrated) or the like of the above-described plate material 27 dividing the rooms. Any of the optical instruments 41 may be also optically connected with the light incidence portion and the light emission portion 29.

Figure 2:
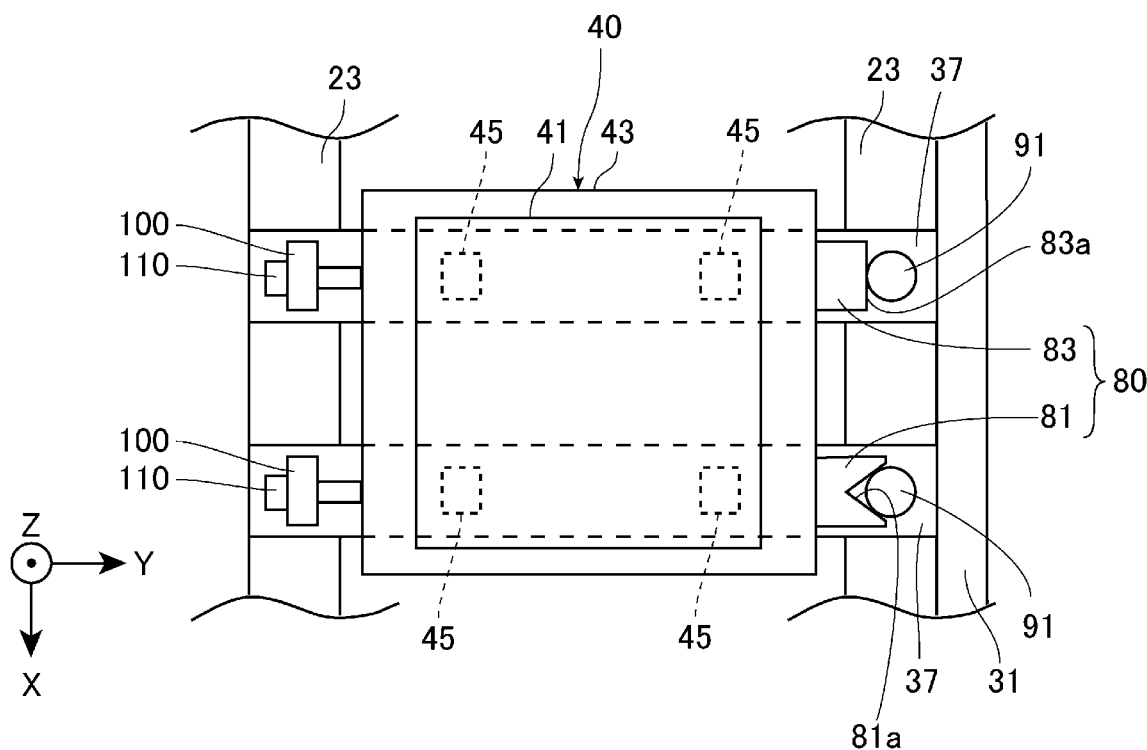
FIG. 2 is a top view of an optical unit positioned in the internal space of a housing in a comparative example.
Figure 3:
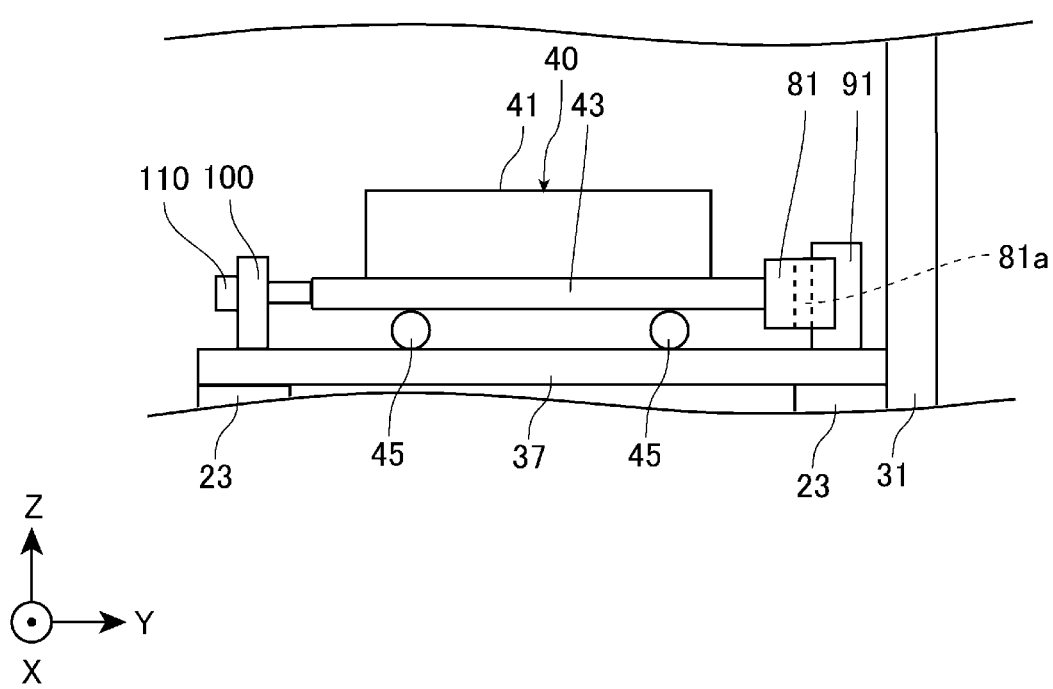
FIG. 3 is a side view of the optical unit illustrated in FIG. 2.

FIG. 2 is a top view of each optical unit 40 positioned in the internal space of the housing 21 in the comparative example. FIG. 3 is a side view of the optical unit 40 illustrated in FIG. 2.

Each optical instrument 41 includes, for example, a mirror configured to reflect, toward another optical instrument 41 or the light emission portion 29, a laser beam incident from the light incidence portion. The optical instrument 41 may include, for example, a lens, a beam profiler, and a photodiode.

Each optical unit 40 also includes a base plate 43, to a principal surface of which the optical instrument 41 is fixed. Four wheels 45 are disposed at front, back, right, and left parts of a bottom surface of the base plate 43.

The wheels 45 can travel on a pair of rails 37 disposed on the frame 23 in each room. The rails 37 are disposed for the optical unit 40 disposed in each room. The rails 37 extend in the Y axial direction and are parallel to each other. Each rail 37 has a leading end disposed on the front side, and a base end disposed on the back side. The disposition interval between the rails 37 in the X axial direction corresponds to the disposition interval between each pair of wheels 45 disposed at right and left parts of the base plate 43. For example, each rail 37 has an L-shaped XZ cross-section, the corresponding wheels 45 are placed on one surface thereof, and the outer surface of each wheel 45 faces the other surface. The rails 37 guide the optical unit 40 placed on the rails 37 in the Y axial direction, and position the optical unit 40 in the Z axial direction, the direction about the X axis, and the direction about the Y axis. The rails 37 may be integrated with or separated from the frame 23 disposed in the X axial direction. FIG. 1 omits illustration of the rails 37 for clear illustration.

Each optical unit 40 including the optical instrument 41 and the base plate 43 is freely movable into and out of the internal space of the housing 21 through the opened front face of the housing 21 as the wheels 45 travel on the rails 37. In addition, the optical unit 40 is slidable along the rails 37 and movable between the front side and the back side.

The optical apparatus 10 includes a pair of pins 91 disposed on the front side of each optical unit 40 in the internal space of the housing 21. Each pin 91 has, for example, a cylinder shape. The pin 91 is fitted to a hole (not illustrated) provided at the leading end of the corresponding rail 37 and is erected on the rail 37. The disposition interval between the pins 91 in the X axial direction corresponds to the disposition interval between a V block 81 and a flat block 83 to be described later. The pins 91 are disposed at the same position in the Y axial direction.

The optical apparatus 10 also includes a positioning portion 80 configured to position each optical unit 40 in the internal space of the housing 21.

In the present comparative example, the positioning portion 80 includes the V block 81 and the flat block 83 disposed on a leading surface of the base plate 43. The leading surface is a surface of the base plate 43 on the front side. The V block 81 and the flat block 83 are disposed opposite to each other on respective sides of the extended line of the central axis of the base plate 43 in the Y axial direction. The V block 81 and the flat block 83 are disposed on the rails 37. The V block 81 and the flat block 83 are disposed at the same position in the Y axial direction and the Z axial direction.

The V block 81 has a V groove shape in a horizontal cross-section at a part contacting one of the pins 91, and the V groove of the V block 81 is concave toward the back side from the front side. The horizontal cross-section is along the XY plane.

The flat block 83 has a flat surface shape in a horizontal cross-section at a part contacting the other pin 91.

When the optical unit 40 moves to the front side, an inner surface 81a of the V groove of the V block 81 contacts the one pin 91 at two points, and a flat surface 83a of the flat block 83 contacts the other pin 91 at one point. In the description of the present specification, "contact" includes at least one of point contact, linear contact, and contact in a minute area range. The optical unit 40 is positioned in the X axial direction through the contact between the one pin 91 and the V block 81. In addition, the optical unit 40 is positioned in the Y axial direction and the direction about the Z axis through the contact between the other pin 91 and the flat block 83. The V block 81 and the flat block 83 position the optical unit 40 at a position where the optical unit 40 is optically connected with another optical unit 40, the light incidence portion, or the light emission portion 29 through the contact with the pins 91.

The pins 91 contacting the V block 81 and the flat block 83 are stoppers configured to prevent the optical unit 40 from being pressed in toward the front side of an appropriate optical connection position. In addition, the pins 91 prevent the optical unit 40 from colliding with a wall part 31 of the back face of the housing 21. The wall part 31 is made of, for example, metal such as stainless steel or aluminum.

The optical apparatus 10 also includes a pair of base blocks 100 that can be freely coupled with and decoupled from the base ends of the respective rails 37, and a pair of fixing members 110 into which the base blocks 100 are inserted in the Y axial direction. The base blocks 100 are fixed to the rails 37 through bolts (not illustrated). The base blocks 100 are disposed at the same position in the Y axial direction. The base blocks 100 are disposed on the back side of the optical unit 40 while the optical unit 40 is in contact with the pins 91. The fixing members 110 are, for example, plungers. The fixing members 110 contact a base end face of the base plate 43 and press the base plate 43 toward the front side so that the V block 81 and the flat block 83 contact the pins 91. The base end face of the base plate 43 is a surface of the base plate 43 on the back side.

2.2 Operation

The following describes operation of positioning each optical unit 40 in the comparative example.

The optical instrument 41 is fixed on the base plate 43. The base plate 43 is introduced through the opened front face of the housing 21 and placed on the rails 37 through the wheels 45. Accordingly, the optical unit 40 is positioned in the Z axial direction, the direction about the X axis, and the direction about the Y axis.

The optical unit 40 being placed on the rails 37 is manually pressed toward the front side through the opened front face of the housing 21. Accordingly, the wheels 45 travel on the rails 37, and the optical unit 40 is pressed into the internal space of the housing 21 and moved to the front side.

The optical unit 40 is positioned in the X axial direction when the inner surface 81a of the V groove of the V block 81 contacts the one pin 91 at two points through the movement of the optical unit 40. In addition, the optical unit 40 is positioned in the Y axial direction and the direction about the Z axis when the flat surface 83a of the flat block 83 contacts the other pin 91 at one point through the movement of the optical unit 40 while the V block 81 is in contact with the one pin 91.

After attached to the base ends of the rails 37, the base blocks 100 are inserted into the fixing members 110, and the fixing members 110 press the base plate 43 toward the front side. Accordingly, the optical unit 40 is pressed against the pins 91 through the base plate 43, the V block 81, and the flat block 83. Then, the optical unit 40 is fixed in the X axial direction, the Y axial direction, and the direction about the Z axis in the internal space of the housing 21 while being sandwiched between each pin 91 and the corresponding fixing member 110 through the base plate 43, the V block 81, and the flat block 83.

The base blocks 100 and the fixing members 110 are removed when the optical instrument 41 is to be subjected to periodic maintenance or to be replaced with another new optical instrument 41. Subsequently, the optical unit 40 is manually pulled back toward the back side and pulled out of the internal space of the housing 21 through the opened front face of the housing 21.

Thereafter, the optical instrument 41 is removed from the base plate 43 and subjected to maintenance or replacement. Subsequently, the optical instrument 41 subjected to the maintenance or a new optical instrument 41 subjected to the replacement is fixed on the base plate 43.

Then, as described above, the optical unit 40 is pressed into the internal space of the housing 21 through the opened front face of the housing 21 and positioned and fixed in the internal space of the housing 21.

2.3 Problem

In the optical apparatus 10 of the comparative example, the V block 81 and the flat block 83 need to be made contact with the pins 91 each time the optical unit 40 is positioned in the internal space of the housing 21. However, it is not easy to visually check whether the contact is appropriately made because sight is blocked by the optical instrument 41 and the base plate 43 disposed on the back side of the V block 81, the flat block 83, and the pins 91. Thus, the reproducibility of the position of the optical unit 40 in the optical apparatus 10 is checked by a guide laser or the like, but some work is needed for the check in some cases. Thus, it is desired to easily check the positioning state.

Thus, the embodiments described below exemplarily present the optical apparatus 10 that allows the positioning state to be easily checked.

3. Description of Optical Apparatus of Embodiment 1

The following describes the configuration of the optical apparatus 10 of Embodiment 1. A component same as that in the above-description is denoted by the same reference sign, and duplicate description thereof is omitted unless otherwise described in particular.

3.1 Configuration

Figure 4:
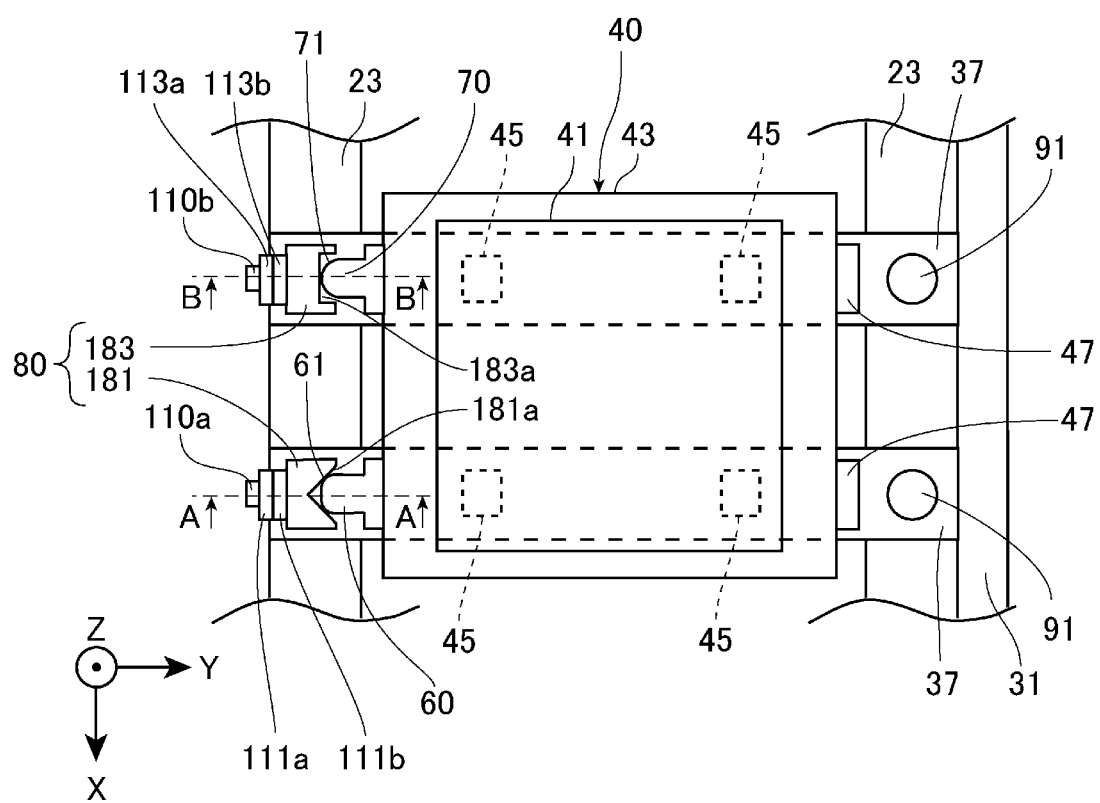
FIG. 4 is a top view of the optical unit positioned in the internal space of the housing in Embodiment 1.
Figure 5:
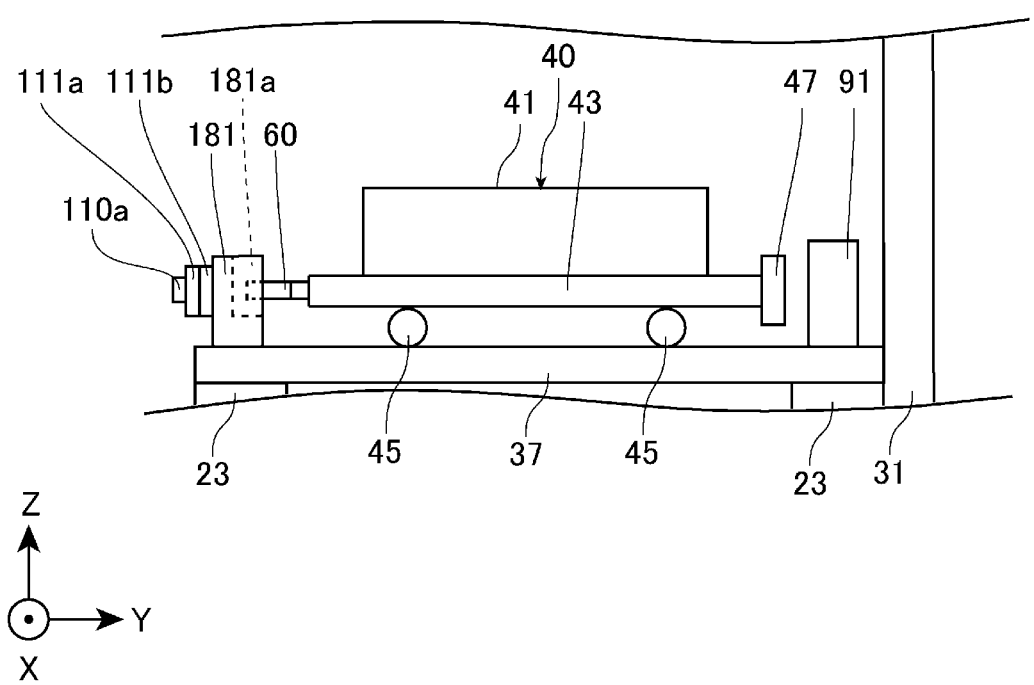
FIG. 5 is a side view of the optical unit illustrated in FIG. 4.

FIG. 4 is a top view of each optical unit 40 positioned in the internal space of the housing 21 in the present embodiment. FIG. 5 is a side view of the optical unit 40 illustrated in FIG. 4. In the optical apparatus 10 of the present embodiment, the configurations of the base plate 43, the positioning portion 80, and first and second fixing members 110a and 110*b* corresponding to the fixing members 110 of the comparative example are different from those of the comparative example.

In the present embodiment, the base plate 43 includes a pair of plates 47 each having a flat plate shape and disposed on the leading surface of the base plate 43. The plates 47 are disposed opposite to each other on respective sides of the extended line of the central axis of the base plate 43 in the Y axial direction. The central axis may be the axis of symmetry extending in the longitudinal direction of the base plate 43 having a rectangular cross-sectional shape in the XY plane. The plates 47 are disposed at the same position in the Y axial direction and the Z axial direction. The disposition interval between the plates 47 in the X axial direction corresponds to the disposition interval between the pins 91. The plates 47 are disposed on the rails 37. Accordingly, the plates 47 contact the pins 91 when the optical unit 40 is pressed into the internal space of the housing 21 and moved to the front side. The plates 47 are, for example, elastic members formed of resin material such as rubber or urethane. The plates 47 absorb impact generated at contact and protect the optical unit 40 from the impact.

In the present embodiment, the base plate 43 includes a first convex portion 60 and a second convex portion 70 disposed on the base end face of the base plate 43.

Figure 6:
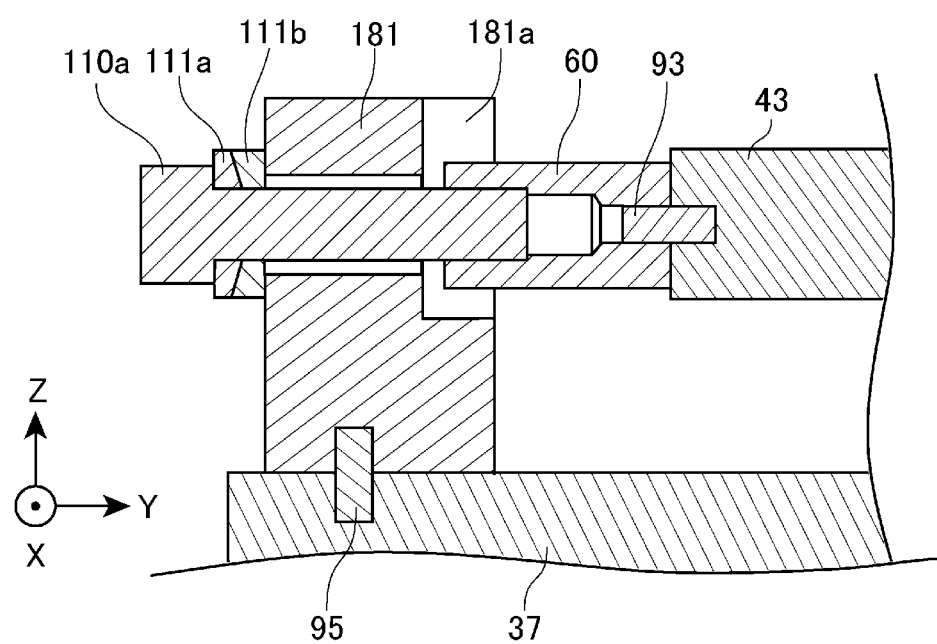
FIG. 6 is a cross-sectional view taken along line A-A illustrated in FIG. 4.
Figure 7:
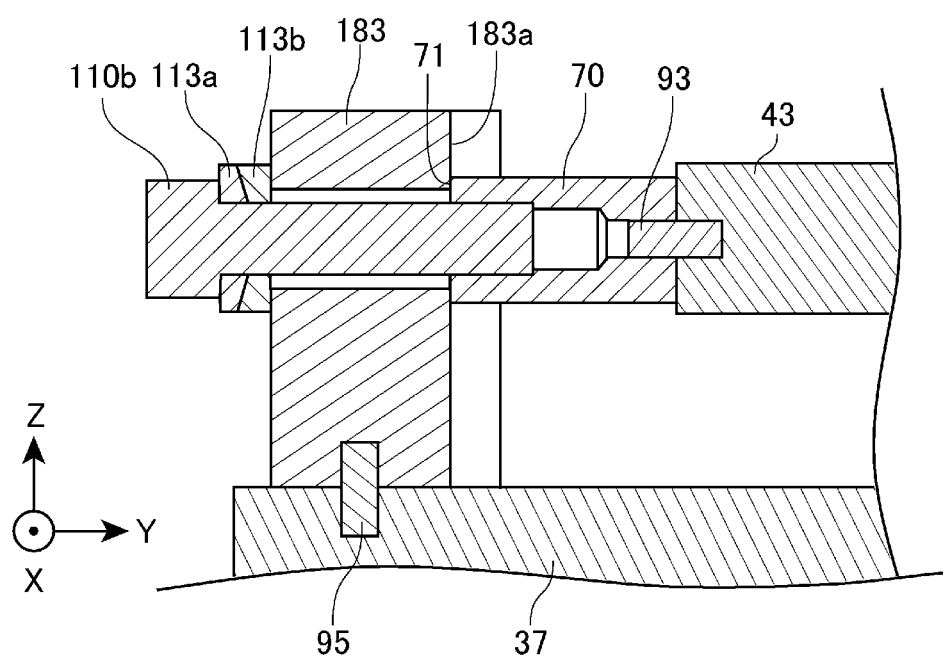
FIG. 7 is a cross-sectional view taken along line B-B illustrated in FIG. 4.

The first convex portion 60 and the second convex portion 70 are positioned on the base end face of the base plate 43 by positioning pins 93 illustrated in FIGS. 6 and 7. The first convex portion 60 and the second convex portion 70 are fixed to the base end face of the base plate 43 by bolts (not illustrated). The first convex portion 60 and the second convex portion 70 protrude toward the back side from the base end face of the base plate 43. The first convex portion 60 and the second convex portion 70 are disposed opposite to each other on respective sides of the extended line of the central axis of the base plate 43. The disposition interval between the first convex portion 60 and the second convex portion 70 in the X axial direction as the width direction of the base plate 43 corresponds to the disposition interval between the rails 37. The first convex portion 60 and the second convex portion 70 are disposed on the rails 37. The first convex portion 60 and the second convex portion 70 are disposed at the same position in the Y axial direction and the Z axial direction. In the Y axial direction, the length of the first convex portion 60 is equal to the length of the second convex portion 70.

In the present embodiment, the positioning portion 80 includes a V block 181 and a flat block 183 disposed on the back side of the optical unit 40 in the internal space of the housing 21 after the optical unit 40 is entirely pressed into the internal space of the housing 21. The V block 181 and the flat block 183 are fitted to positioning pins 95 illustrated in FIGS. 6 and 7. The positioning pins 95 are fitted to holes (not illustrated) provided at the base ends of the rails 37 and are erected on the rails 37. The V block 181 and the flat block 183 are positioned on the rails 37 through the fitting to the positioning pins 95. The positioning pins 95 are disposed at the same position in the Y axial direction. The V block 181 and the flat block 183 are disposed at the same position in the Y axial direction through the fitting to the positioning pins 95. The V block 181 and the flat block 183 are disposed opposite to each other on respective sides of the extended line of the central axis of the base plate 43. The V block 181 and the flat block 183 are fixed to the base ends of the rails 37 by, for example, bolts (not illustrated).

In the Y axial direction, the V block 181 is disposed opposite to the first convex portion 60, and the flat block 183 is disposed opposite to the second convex portion 70. The V block 181 is disposed on the back side of the optical unit 40 in the Y axial direction with a gap between the V block 181 and the first convex portion 60 so that the optical unit 40 can be pulled back to the back side while the plates 47 are in contact with the pins 91. In other words, in the Y axial direction, the distance between an inner surface 181*a* of the V block 181 to be described later and the one pin 91 is longer than the distance between the leading end of one of the plates 47 and a curved surface 61 of the first convex portion 60 to be described later. The one pin 91 and the one plate 47 are disposed coaxially with the V block 181. The flat block 183 is disposed on the back side of the optical unit 40 with a gap between the flat block 183 and the second convex portion 70 in the Y axial direction so that the optical unit 40 can be pulled back to the back side while the plates 47 are in contact with the pins 91. In other words, in the Y axial direction, the distance between a bottom surface 183*a* of the flat block 183 to be described later and the other pin 91 is longer than the distance between the leading end of the other plate 47 and a curved surface 71 of the second convex portion 70 to be described later. The other pin 91 and the other plate 47 are disposed coaxially with the flat block 183.

The following describes the V block 181 and the first convex portion 60 that contacts the V block 181.

The V block 181 has a V groove shape in a horizontal cross-section at a part contacting the first convex portion 60, and the V groove of the V block 181 is concave toward the back side from the front side. When the optical unit 40 moves to the back side, the inner surface 181*a* of the V groove contacts the first convex portion 60 at two places.

The first convex portion 60 includes the two curved surfaces 61 that contact the inner surface 181*a* of the V groove of the V block 181. The first convex portion 60 has a column shape, and each curved surface 61 is a chamfered corner at a base end of the first convex portion 60, which contacts the inner surface 181*a* of the V groove. In other words, the base end of the first convex portion 60, which contacts the V block 181, has an arc shape in a horizontal cross-section.

The following describes the flat block 183 and the second convex portion 70 that contacts the flat block 183.

The flat block 183 has a concave shape in a horizontal cross-section at a part contacting the second convex portion 70, and a concave portion of the flat block 183 is concave toward the back side from the front side. The bottom surface 183*a* of the concave portion is a flat surface. When the optical unit 40 moves to the back side, the bottom surface 183*a* contacts the second convex portion 70 at one place.

The second convex portion 70 has a column shape. A base end of the second convex portion 70 has a semi-cylindrical shape. At the base end, the second convex portion 70 includes the curved surface 71 that contacts the bottom surface 183*a* of the flat block 183 at one place. The curved surface 71 is, for example, a curved surface having a semi-circular cross-section. In other words, the base end of the second convex portion 70, which contacts the flat block 183, has an arc shape in a horizontal cross-section.

The following describes the first fixing member 110*a* with reference to FIG. 6. FIG. 6 is a cross-sectional view taken along line A-A illustrated in FIG. 4.

In the present embodiment, the first fixing member 110*a* is, for example, a bolt. The first fixing member 110*a* is disposed coaxially with the center of the first convex portion 60. The first fixing member 110*a* penetrates through the V block 181 in the Y axial direction and is screwed with the first convex portion 60. When a head of the first fixing member 110a contacts the V block 181, progress of the first fixing member 110a in the Y axial direction is stopped. In this state, as the first fixing member 110a rotates about the longitudinal axis of the first fixing member 110a, the first convex portion 60 screwed with the first fixing member 110a is pulled toward the V block 181 and moved to the back side. In other words, the first fixing member 110a pulls the curved surfaces 61 of the first convex portion 60 toward the inner surface 181a of the V block 181 through rotation about the longitudinal axis of the first fixing member 110a.

A pair of spherical washers 111a and 111b are disposed between the head of the first fixing member 110a and the V block 181. Facing bearing surfaces of the spherical washers 111a and 111b are convex and concave spherical surfaces.

The following describes the second fixing member 110b with reference to FIG. 7. FIG. 7 is a cross-sectional view taken along line B-B illustrated in FIG. 4

In the present embodiment, the second fixing member 110b is, for example, a bolt. The second fixing member 110b is disposed coaxially with the center of the second convex portion 70. The second fixing member 110b penetrates through the flat block 183 in the Y axial direction and is screwed with the second convex portion 70. When a head of the second fixing member 110b contacts the flat block 183, progress of the second fixing member 110b in the Y axial direction is stopped. In this state, as the second fixing member 110b rotates about the longitudinal axis of the second fixing member 110b, the second convex portion 70 screwed with the second fixing member 110b is pulled toward the flat block 183 and moved to the back side. In other words, the second fixing member 110b pulls the curved surface 71 of the second convex portion 70 toward the bottom surface 183a of the flat block 183 through rotation of the longitudinal axis of the second fixing member 110b.

A pair of spherical washers 113a and 113b are disposed between the head of the second fixing member 110b and the flat block 183. Facing bearing surfaces of the spherical washers 113a and 113b are convex and concave spherical surfaces.

3.2 Operation

The following describes operation of positioning each optical unit 40 in the present embodiment.

Similarly to the comparative example, the optical instrument 41 is fixed on the base plate 43. The base plate 43 is introduced through the opened front face of the housing 21 and placed on the rails 37 through the wheels 45. Accordingly, the optical unit 40 is positioned in the Z axial direction, the direction about the X axis, and the direction about the Y axis.

Similarly to the comparative example, the optical unit 40 being placed on the rails 37 is manually pressed toward the front side through the opened front face of the housing 21. Accordingly, the wheels 45 travel on the rails 37, and the optical unit 40 is pressed into the internal space of the housing 21 and moved to the front side.

When the optical unit 40 is pressed into the internal space of the housing 21, the plates 47 contact the pins 91. Accordingly, collision between the optical unit 40 and the wall part 31 of the housing 21 is prevented. The plates 47 absorb impact generated at contact and protect the optical unit 40 from the impact. While the plates 47 are in contact with the pins 91, the base ends of the first convex portion 60 and the second convex portion 70 are positioned on the front side of the disposition positions of the V block 181 and the flat block 183.

The positioning pins 95 are fitted to the base ends of the rails 37, and the V block 181 and the flat block 183 are fitted to the positioning pins 95 and positioned at the base ends of the rails 37. The V block 181 and the flat block 183 are fixed to the base ends of the rails 37 by bolts (not illustrated). Accordingly, the V block 181 and the flat block 183 are disposed on the back side of the optical unit 40 disposed in the internal space of the housing 21. In the Y axial direction, a gap is provided between the inner surface 181a of the V groove of the V block 181 and each curved surface 61 of the first convex portion 60, and a gap is provided between the concave portion of the bottom surface 183a of the flat block 183 and the curved surface 71 of the second convex portion 70. Thus, the optical unit 40 can be pulled back to the back side.

The optical unit 40 is manually pulled back toward the opened front face of the housing 21 in the internal space of the housing 21. In other words, the wheels 45 travel on the rails 37, and the optical unit 40 is pulled back to the front face side in the internal space of the housing 21. In addition, the plates 47 are separated from the pins 91, and a gap is provided between each plate 47 and the corresponding pin 91.

The two curved surfaces 61 of the first convex portion 60 contact the inner surface 181a of the V groove of the V block 181 through the pullback. Accordingly, the optical unit 40 is positioned in the X axial direction.

In addition, the curved surface 71 of the second convex portion 70 contacts the concave portion of the bottom surface 183a of the flat block 183 through the pullback. Accordingly, the optical unit 40 is positioned in the Y axial direction and the direction about the Z axis.

The second convex portion 70 and the first convex portion 60 are disposed at the same position in the Y axial direction, and the flat block 183 and the V block 181 are disposed at the same position in the Y axial direction. When the optical unit 40 is pulled back in the Y axial direction, the contact between the curved surface 71 of the second convex portion 70 and the concave portion of the bottom surface 183a of the flat block 183 occurs simultaneously with the contact between each of the two curved surfaces 61 of the first convex portion 60 and the inner surface 181a of the V groove of the V block 181. When the optical unit 40 is pulled back at a tilt relative to the Y axial direction, one of the contact between the second convex portion 70 and the flat block 183 and the contact between the first convex portion 60 and the V block 181 occurs earlier than the other. The optical unit 40 rotates about a part having made contact earlier in the direction about the Z axial direction, and accordingly, the other contact occurs. For example, when the curved surfaces 61 contact the inner surface 181a before the curved surface 71 contacts the bottom surface 183a, the optical unit 40 rotates about the curved surfaces 61 in the direction about the Z axial direction. Accordingly, the curved surface 71 contacts the bottom surface 183a while the curved surfaces 61 is in contact with the inner surface 181a. For example, when the curved surface 71 contacts the bottom surface 183a before the curved surfaces 61 contact the inner surface 181a, the optical unit 40 rotates about the curved surface 71 in the direction about the Z axial direction. Accordingly, the curved surface 71 rolls on the bottom surface 183a in the direction about the Z axial direction, and the curved surfaces 61 contact the inner surface 181a.

Subsequently, while the two curved surfaces 61 of the first convex portion 60 are in contact with the inner surface 181a of the V groove of the V block 181, the first fixing member 110a penetrates through the spherical washers 111a and 111b and the V block 181. In addition, the first fixing member 110a becomes screwed with the first convex portion 60 through rotation about the longitudinal axis of the first fixing member 110a. The convex and concave shapes of the spherical washers 111a and 111b support insertion of the first fixing member 110a into the V block 181 and the first convex portion 60 in the Y axial direction. When the head of the first fixing member 110a contacts the V block 181, progress of the first fixing member 110a in the Y axial direction is stopped. In this state, as the first fixing member 110a further rotates about the longitudinal axis of the first fixing member 110a, the first convex portion 60 moves toward the V block 181 due to the screwing between the first fixing member 110a and the first convex portion 60. In other words, the first fixing member 110a pulls the first convex portion 60 toward the V block 181. Accordingly, the two curved surfaces 61 of the first convex portion 60 are pressed against the inner surface 181a of the V groove of the V block 181, and the optical unit 40 is fixed in the X axial direction.

While the curved surface 71 of the second convex portion 70 is in contact with the concave portion of the bottom surface 183a of the flat block 183, the second fixing member 110b penetrates through the spherical washers 113a and 113b and the flat block 183. In addition, the second fixing member 110b becomes screwed with the second convex portion 70 through rotation about the longitudinal axis of the second fixing member 110b. The convex and concave shapes of the spherical washers 113a and 113b support insertion of the second fixing member 110b into the flat block 183 and the second convex portion 70 in the Y axial direction. When the head of the second fixing member 110b contacts the flat block 183, progress of the second fixing member 110b in the Y axial direction is stopped. In this state, as the second fixing member 110b further rotates about the longitudinal axis of the second fixing member 110b, the second convex portion 70 moves toward the flat block 183 due to the screwing between the second fixing member 110b and the second convex portion 70. In other words, the second fixing member 110b pulls the second convex portion 70 toward the flat block 183. Accordingly, the curved surface 71 of the second convex portion 70 is pressed against the concave portion of the bottom surface 183a of the flat block 183, and the optical unit 40 is fixed in the Y axial direction and the direction about the Z axis.

When the optical instrument 41 is to be subjected to periodic maintenance or to be replaced with another new optical instrument 41, the first fixing member 110a is pulled out of the V block 181 and the first convex portion 60, and the second fixing member 110b is pulled out of the flat block 183 and the second convex portion 70. The bolts fixing the V block 181 and the flat block 183 to the rails 37 are removed, and the V block 181 and the flat block 183 are removed from the rails 37 together with the positioning pins 95.

Similarly to the comparative example, the optical unit 40 is manually pulled back toward the back side and pulled out of the internal space of the housing 21 through the opened front face of the housing 21. Thereafter, the optical instrument 41 is removed from the base plate 43 and subjected to maintenance or replacement. Subsequently, the optical instrument 41 subjected to the maintenance or a new optical instrument 41 subjected to the replacement is fixed on the base plate 43.

Then, as described above, the optical unit 40 is pressed into the internal space of the housing 21 through the opened front face of the housing 21 and positioned and fixed in the internal space of the housing 21.

3.3 Effect

In the present embodiment, the first convex portion 60 and the second convex portion 70 are disposed on the base end face of the base plate 43, and the second convex portion 70 is disposed at a position different from the first convex portion 60 in the X axial direction. The V block 181 and the flat block 183 are disposed on the back side of the optical unit 40 in the internal space of the housing 21, the V block 181 contacts the first convex portion 60 at two places, and the flat block 183 contacts the second convex portion 70 at one place. The optical unit 40 is positioned in the internal space of the housing 21 through the contact between the first convex portion 60 and the V block 181 and the contact between the second convex portion 70 and the flat block 183.

As described above, positioning is performed on the back side of the optical unit 40. This prevents sight blockage due to the optical instrument 41 and the base plate 43 when the state of positioning is visually checked.

Thus, the optical apparatus 10 of the present embodiment allows the positioning state to be easily checked.

In the present embodiment, when the reproducibility of the position of the optical unit 40 is checked by a guide laser or the like, the amount of work needed for the check can be reduced since positioning is performed on the back side as compared to a case in which positioning is performed on the front side, and thus the position of the optical unit 40 can be easily readjusted. In addition, the check can be easily visually performed, and thus use of the guide laser can be reduced.

In the present embodiment, the first convex portion 60 has a column shape, and the base end of the first convex portion 60, which contacts the V block 181, has an arc shape in a horizontal cross-section.

Thus, the first convex portion 60 can contact the inner surface 181a of the V groove of the V block 181 at two places and can position the optical unit 40 in the X axial direction.

In the present embodiment, the first fixing member 110a pulls the first convex portion 60 toward the V block 181.

Thus, the first convex portion 60 can be pressed against the V block 181, and the optical unit 40 can be more reliably fixed in the X axial direction than a case with no pulling by the first fixing member 110a.

In the present embodiment, the first fixing member 110a is disposed coaxially with the center of the first convex portion 60.

Thus, pulling force of the first fixing member 110a can be more likely to be transferred to the first convex portion 60 than a case in which the first fixing member 110a is not disposed coaxially with the center of the first convex portion 60, and accordingly, the first convex portion 60 can be easily pulled toward the V block 181.

In the present embodiment, the second convex portion 70 has a column shape, and the base end of the second convex portion 70, which contacts the flat block 183, has an arc shape in a horizontal cross-section.

Thus, the second convex portion 70 can contact the concave portion of the bottom surface 183a of the flat block 183 and can position the optical unit 40 in the Y axial direction and the direction about the Z axis.

In the present embodiment, the second fixing member 110b pulls the second convex portion 70 toward the flat block 183.

Thus, the second convex portion 70 can be pressed against the flat block 183, the optical unit 40 can be more reliably fixed in the Y axial direction and the direction about the Z axis than a case with no pulling by the second fixing member 110*b*.

In the present embodiment, the second fixing member 110*b* is disposed coaxially with the center of the second convex portion 70.

Thus, pulling force of the second fixing member 110*b* can be more likely to be transferred to the second convex portion 70 than a case in which the second fixing member 110*b* is not disposed coaxially with the center of the second convex portion 70, and the second convex portion 70 can be easily pulled toward the flat block 183.

In the present embodiment, the positioning portion 80 is disposed on the back side of the optical unit 40 after the optical unit 40 is pressed into the internal space of the housing 21. When the optical unit 40 is pulled back toward the positioning portion 80, the first convex portion 60 and the V block 181 contact each other, and the second convex portion 70 and the flat block 183 contact each other.

Accordingly, the positioning portion 80 is not disposed on the front side of the optical unit 40 when the optical unit 40 is pressed into the internal space of the housing 21, and thus collision between the optical unit 40 and the positioning portion 80 at the press-in can be prevented. In addition, since the contact is performed through pullback of the optical unit 40, the positioning state can be checked on the back side of the optical unit 40.

In the present embodiment, decentering of the first fixing member 110*a* from the V block 181 can be absorbed by the spherical washers 111*a* and 111*b*, and the first fixing member 110*a* can be moved in the Y axial direction by the spherical washers 111*a* and 111*b*. Thus, the first fixing member 110*a* can pull the first convex portion 60 toward the V block 181 in the Y axial direction and can fix the first convex portion 60 in the X axial direction.

In the present embodiment, decentering of the second fixing member 110*b* from the flat block 183 can be absorbed by the spherical washers 113*a* and 113*b*, and the second fixing member 110*b* can be moved in the Y axial direction by the spherical washers 113*a* and 113*b*. Thus, the second fixing member 110*b* can pull the second convex portion 70 toward the flat block 183 in the Y axial direction and can fix the second convex portion 70 in the Y axial direction and the direction about the Z axis.

The first fixing member 110*a* is a bolt in the above description but is not limited thereto as long as the first fixing member 110*a* can press the first convex portion 60 toward the V block 181. The first fixing member 110*a* may be, for example, a spring member that pulls the optical unit 40 toward the V block 181. Alternatively, for example, the first fixing member 110*a* may sandwich the first convex portion 60 and the V block 181 to press the first convex portion 60 toward the V block 181. This description is made on the first fixing member 110*a*, but the same applies to the second fixing member 110*b*.

The first convex portion 60 may contact the inner surface 181*a* of the V groove of the V block 181 at two places, and the curved surfaces 61 of the first convex portion 60 may be each a curved surface having a semi-circular cross-section like the curved surface 71 of the second convex portion 70.

The first convex portion 60 may be disposed at a position different from the second convex portion 70 in the Z axial direction as long as the first convex portion 60 is disposed at a position different from the second convex portion 70 in the X axial direction.

In the present embodiment, the V block 181 and the flat block 183 are disposed after the plates 47 contact the pins 91. However, the V block 181 and the flat block 183 may be disposed on the back side of the optical unit 40 after the optical unit 40 is pressed to the front side of the disposition positions of the V block 181 and the flat block 183. In this case, the optical unit 40 may be manually pulled back toward the V block 181 and the flat block 183 before the plates 47 contact the pins 91.

4. Description of Optical Apparatus of Embodiment 2

The following describes the configuration of the optical apparatus 10 of Embodiment 2. A component same as that in the above-description is denoted by the same reference sign, and duplicate description thereof is omitted unless otherwise described in particular.

4.1 Configuration

Figure 8:
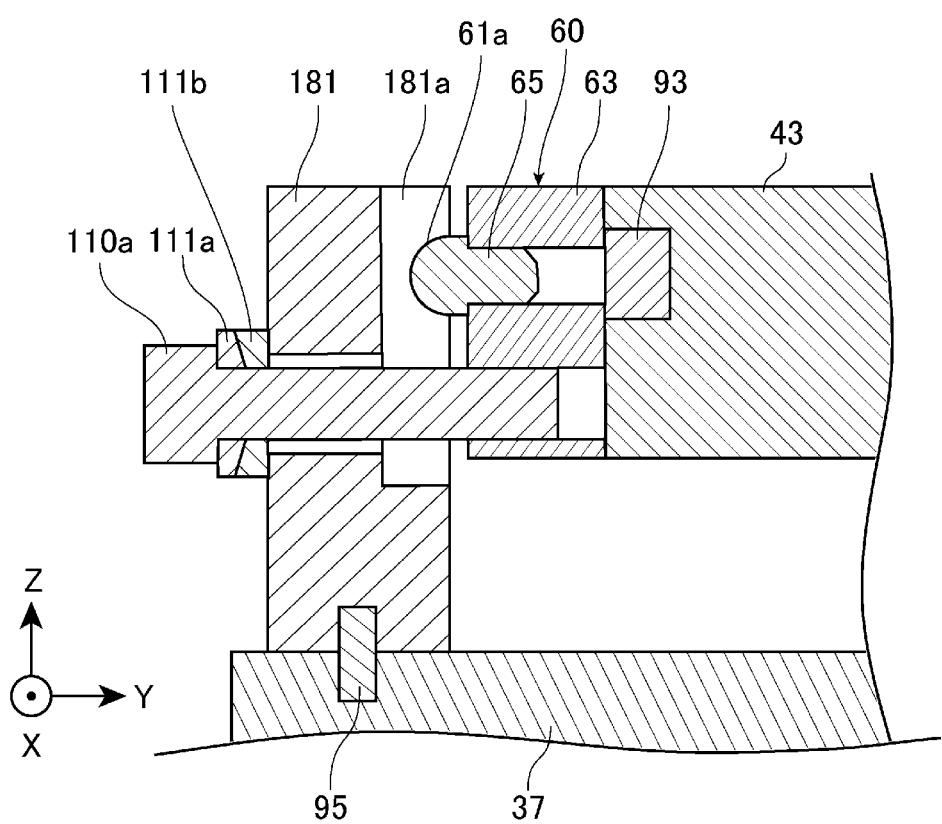
FIG. 8 is a cross-sectional view of Embodiment 2 taken along line A-A illustrated in FIG. 4.
Figure 9:
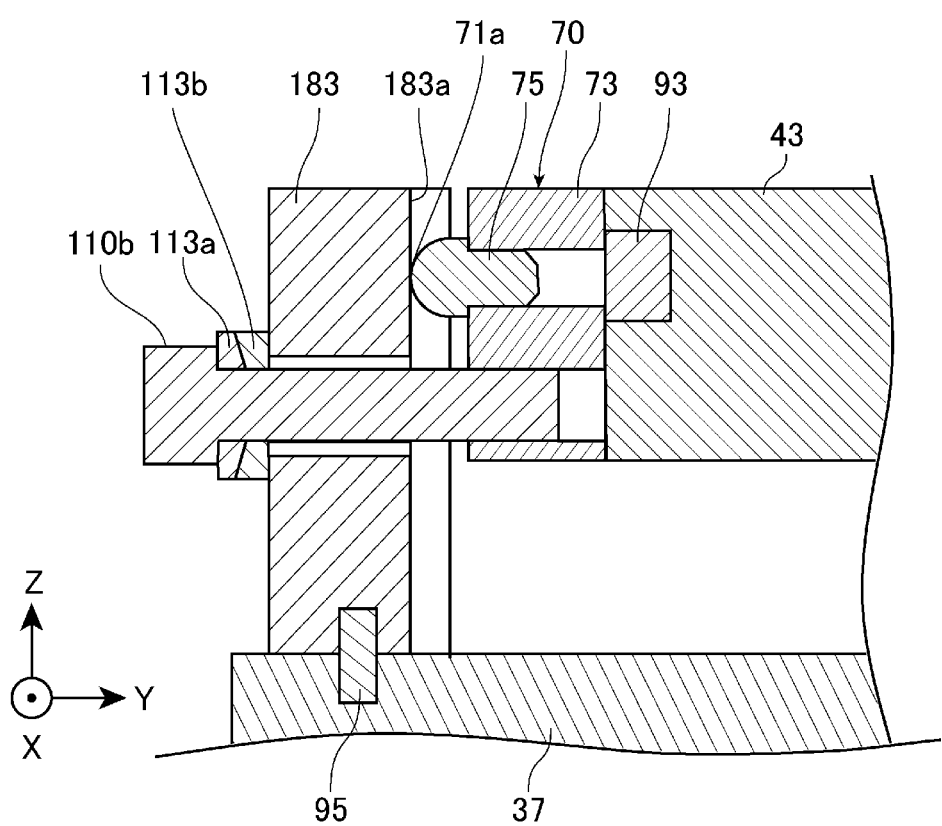
FIG. 9 is a cross-sectional view of Embodiment 2 taken along line B-B illustrated in FIG. 4.

FIG. 8 is a cross-sectional view of the present embodiment taken along line A-A illustrated in FIG. 4. FIG. 9 is a cross-sectional view of the present embodiment taken along line B-B illustrated in FIG. 4. In the present embodiment, the configurations of the first convex portion 60 and the second convex portion 70 are different from those of Embodiment 1.

As illustrated in FIG. 8, the first convex portion 60 includes a first body part 63 disposed on the base end face of the base plate 43, and a first pin 65 engaged with the first body part 63 to protrude toward the back side. The first body part 63 is fixed to the base end face of the base plate 43 by the positioning pins 93 and bolts (not illustrated). A base end face of the first body part 63 is not inserted into the V groove of the V block 181 but is disposed separately from the V block 181. A base end of the first pin 65 protruding toward the back side from the first body part 63 has a semi-spherical shape. At this base end, the first pin 65 includes a semi-spherical surface 61*a* that point-contacts the inner surface 181*a* of the V groove of the V block 181 at two places.

The first fixing member 110*a* is screwed with the first body part 63 at a position different from the first pin 65 in the Z axial direction. In the present embodiment, the first fixing member 110*a* is screwed with the first body part 63 at a position lower than the first pin 65 in the Z axial direction. The first fixing member 110*a* is preferably screwed with the first body part 63 at a position directly below the first pin 65.

As illustrated in FIG. 9, the second convex portion 70 includes a second body part 73 disposed on the base end face of the base plate 43, and a second pin 75 engaged with the second body part 73 to protrude toward the back side. The second body part 73 is fixed to the base end face of the base plate 43 by the positioning pins 93 and bolts (not illustrated). A base end face of the second body part 73 is not inserted into the concave portion of the flat block 183 but is disposed separately from the flat block 183. A base end of the second pin 75 protruding toward the back side from the second body part 73 has a semi-spherical shape. At this base end, the second pin 75 includes a semi-spherical surface 71*a* that point-contacts the concave portion of the bottom surface 183*a* of the flat block 183 at one place. In the Y axial direction, the length of the second pin 75 is equal to the length of the first pin 65.

The second fixing member 110*b* is screwed with the second body part 73 at a position different from the second pin 75 in the Z axial direction. In the present embodiment, the second fixing member 110*b* is screwed with the second body part 73 at a position lower than the second pin 75 in the Z axial direction. The second fixing member 110*b* is preferably screwed with the second body part 73 at a position directly below the second pin 75.

4.2 Effect

In the present embodiment, the first convex portion 60 includes the first body part 63 and the first pin 65, and the first pin 65 includes the semi-spherical surface 61*a*.

Accordingly, the first convex portion 60 can point-contact the inner surface 181*a* of the V groove of the V block 181 at two places and can position the optical unit 40 in the X axial direction. The optical unit 40 can be more accurately positioned in the X axial direction through point-contact than a case of contact other than point-contact.

In the present embodiment, the first fixing member 110*a* is screwed with the first body part 63 at a position lower than the first pin 65.

Accordingly, when the first fixing member 110*a* pulls the first convex portion 60 toward the V block 181, the optical unit 40 receives clockwise force, when viewed in the positive X axial direction illustrated in FIG. 8, about a point-contact part between the semi-spherical surface 61*a* and the inner surface 181*a* of the V groove of the V block 181. Part of the optical unit 40, which is closer to the leading end is more strongly pressed against the rails 37 by the clockwise force. Thus, positional shift of the optical unit 40 in the X axial direction can be more reliably prevented than a case in which the optical unit 40 receives no clockwise force. In addition, even when the first pin 65 is tilted about the point-contact part by the clockwise force, the first pin 65 can point-contact the inner surface 181*a* of the V groove of the V block 181 at two places through the semi-spherical surface 61*a*. Thus, positional shift of the optical unit 40 in the X axial direction can be prevented. In addition, since the first pin 65 is disposed higher than the first fixing member 110*a*, the state of contact between the semi-spherical surface 61*a* of the first pin 65 and the inner surface 181*a* of the V groove of the V block 181 can be easily visually checked from above the V block 181.

In the present embodiment, the spherical washers 111*a* and 111*b* are disposed between the head of the first fixing member 110*a* and the V block 181.

Any tilt of the first fixing member 110*a* relative to the Y axial direction by the clockwise force is prevented by the convex and concave shapes of the spherical washers 111*a* and 111*b*. Thus, the first fixing member 110*a* can be more reliably disposed in the Y axial direction than a case in which no spherical washers 111*a* and 111*b* are disposed, and the pulling force of the first fixing member 110*a* can be more easily transferred to the first convex portion 60.

In the present embodiment, the second convex portion 70 includes the second body part 73 and the second pin 75, and the second pin 75 includes the semi-spherical surface 71*a*.

Accordingly, the second convex portion 70 can point-contact the concave portion of the bottom surface 183*a* of the flat block 183 at one place and can position the optical unit 40 in the Y axial direction and the direction about the Z axis. The optical unit 40 can be more accurately positioned in the Y axial direction and the direction about the Z axis through point-contact than a case of contact other than point-contact.

In the present embodiment, the second fixing member 110*b* is screwed with the second body part 73 at a position lower than the second pin 75.

Accordingly, when the second fixing member 110*b* pulls the second convex portion 70 toward the flat block 183, the optical unit 40 receives clockwise force, when viewed in the positive X axial direction illustrated in FIG. 9, about a point-contact part between the semi-spherical surface 71*a* and the concave portion of the bottom surface 183*a* of the flat block 183. Part of the optical unit 40, which is closer to the leading end is more strongly pressed against the rails 37 by the clockwise force. Thus, positional shift of the optical unit 40 in the Y axial direction and the direction about the Z axis can be more reliably prevented than a case in which the optical unit 40 receives no clockwise force. In addition, even when the second pin 75 is tilted about the point-contact part by the clockwise force, the second pin 75 can point-contact the concave portion of the bottom surface 183*a* of the flat block 183 through the semi-spherical surface 71*a*. Thus, positional shift of the optical unit 40 in the Y axial direction and the direction about the Z axis can be prevented. In addition, since the second pin 75 is disposed higher than the second fixing member 110*b*, the state of contact between the semi-spherical surface 71*a* of the second pin 75 and the concave portion of the bottom surface 183*a* of the flat block 183 can be easily visually checked from above the flat block 183.

In the present embodiment, the spherical washers 113*a* and 113*b* are disposed between the head of the second fixing member 110*b* and the flat block 183.

Any tilt of the second fixing member 110*b* relative to the Y axial direction by the clockwise force is prevented by the convex and concave shapes of the spherical washers 113*a* and 113*b*. Thus, the second fixing member 110*b* can be more reliably disposed in the Y axial direction than a case in which no spherical washers 113*a* and 113*b* are disposed, and the pulling force of the second fixing member 110*b* can be more easily transferred to the second convex portion 70.

The first pin 65 of the present embodiment may include the two curved surfaces 61 that have arc shapes and contact the inner surface 181*a* of the V groove of the V block 181 as in Embodiment 1. In addition, the second pin 75 may include the curved surface 71 as in Embodiment 1.

5. Description of Optical Apparatus of Embodiment 3

The following describes the configuration of the optical apparatus 10 of Embodiment 3. A component same as that in the above-description is denoted by the same reference sign, and duplicate description thereof is omitted unless otherwise described in particular.

5.1 Configuration

Figure 10:
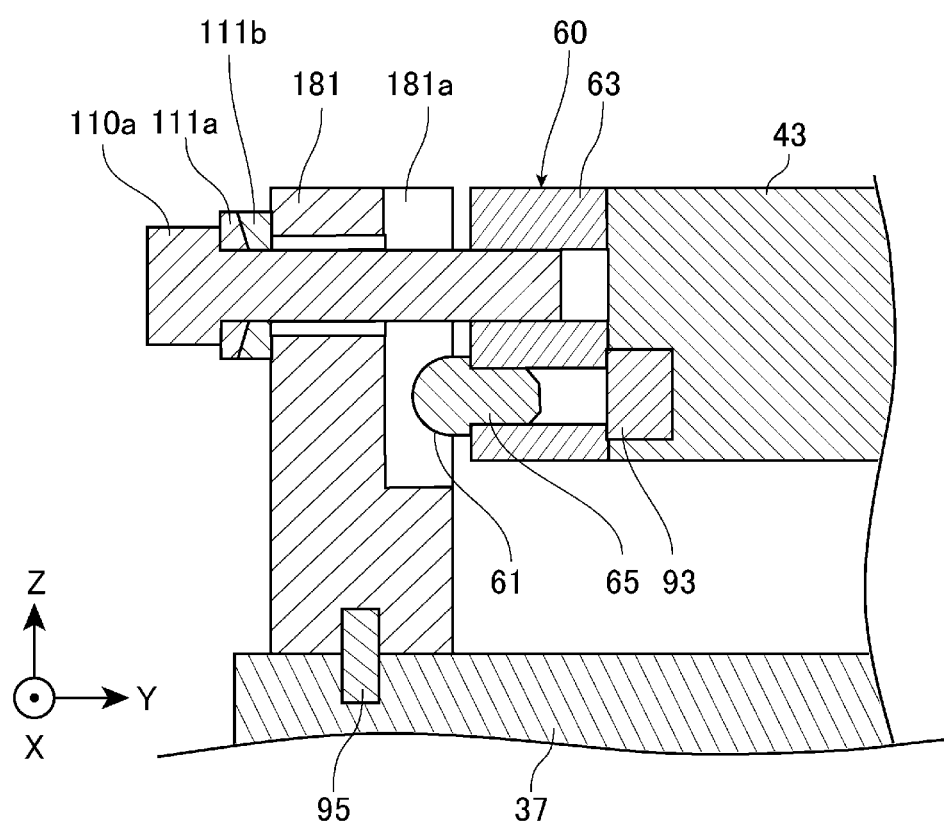
FIG. 10 is a cross-sectional view of Embodiment 3 taken along line A-A illustrated in FIG. 4.
Figure 11:
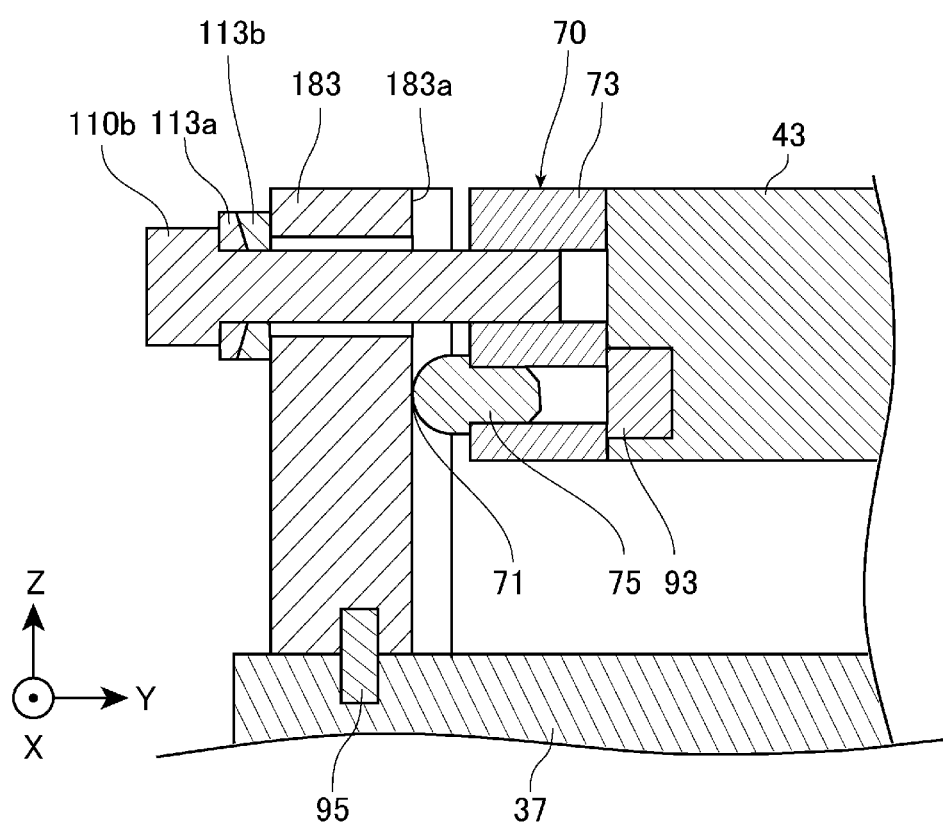
FIG. 11 is a cross-sectional view of Embodiment 3 taken along line B-B illustrated in FIG. 4.

FIG. 10 is a cross-sectional view of the present embodiment taken along line A-A illustrated in FIG. 4. FIG. 11 is a cross-sectional view of the present embodiment taken along line B-B illustrated in FIG. 4. In the present embodiment, the positions of the first fixing member 110*a* and the first pin 65 and the positions of the second fixing member 110*b* and the second pin 75 are different from those of Embodiment 2.

As illustrated in FIG. 10, in the present embodiment, the first fixing member 110*a* is screwed with the first body part 63 at a position higher than the first pin 65 in the Z axial direction. The first fixing member 110*a* is preferably screwed with the first body part 63 at a position directly above the first pin 65.

As illustrated in FIG. 11, in the present embodiment, the second fixing member 110*b* is screwed with the second body part 73 at a position higher than the second pin 75 in the Z axial direction. The second fixing member 110*b* is preferably screwed with the second body part 73 at a position directly above the second pin 75.

5.2 Effect

The first fixing member 110a is disposed higher than the first pin 65. Accordingly, the first fixing member 110a can be more easily screwed with the first body part 63 than a case in which the first fixing member 110a is not disposed higher than the first pin 65, and the state of screwing between the first fixing member 110a and the first body part 63 can be easily visually checked from above the V block 181.

The second fixing member 110b is disposed higher than the second pin 75. Accordingly, the second fixing member 110b can be more easily screwed with the second body part 73 than a case in which the second fixing member 110b is not disposed higher than the second pin 75, and the state of screwing between the second fixing member 110b and the second body part 73 can be easily visually checked from above the flat block 183.

The configurations of the first convex portion and the V block in an embodiment described above may be combined with the configurations of the second convex portion and the flat block in another embodiment described above.

A surface of the first convex portion 60 of Embodiment 1, which faces the inner surface 181a of the V groove may be a semi-spherical surface like the first pin 65 of Embodiment 2. This description is made on the first convex portion 60, but the same applies to the second convex portion 70.

The above description is made with the example in which a plurality of optical units 40 are disposed in the housing 21, but only one optical unit 40 may be disposed in the housing 21.

In Embodiments 2 and 3, the first body part 63 may be integrated with the second body part 73. The first pin 65 may be disposed on the base end face of the base plate 43 without the first body part 63. The second pin 75 may be disposed on the base end face of the base plate 43 without the second body part 73.

The optical apparatus 10 may include the laser apparatus and may have a configuration in which a laser beam output from the laser apparatus is emitted toward the amplification module or the extreme ultraviolet light generation apparatus through the optical unit 40 and the light emission portion 29. In this case, no light incidence portion may be disposed.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. An optical apparatus comprising:
a housing having an opened front face;
an optical unit including an optical instrument and a base plate and freely movable into and out of an internal space of the housing through the front face of the housing, the optical instrument being fixed to the base plate; and
a positioning portion disposed on a back side of the optical unit in the internal space of the housing, the back side being defined to be a side toward which the optical unit is pulled out in a movement direction of the optical unit,
the base plate including
a first convex portion disposed on a base end face of the base plate on the back side, and
a second convex portion disposed on the base end face of the base plate,
the second convex portion being disposed at a position different from the first convex portion in a width direction of the base plate, the width direction being orthogonal to the movement direction,
the positioning portion including
a V block having a V groove shape in a horizontal cross-section at a part contacting the first convex portion, the V block contacting the first convex portion at two places, and
a flat block having a flat surface shape in a horizontal cross-section at a part contacting the second convex portion, and
the optical unit being positioned in the internal space of the housing through the contact between the first convex portion and the V block and the contact between the second convex portion and the flat block, wherein
the first convex portion includes
a first body part disposed on the base end face of the base plate, and
a first pin engaged with the first body part to protrude toward the back side, the first pin has a semi-spherical surface that point-contacts the V block at the two places, the optical apparatus further comprises a first fixing member penetrating through the V block and screwed with the first body part to pull the first pin toward the V block, and
the first fixing member is screwed with the first body part at a position lower than the first pin in a height direction of the housing, the height direction being orthogonal to the movement direction.

2. An optical apparatus comprising:
a housing having an opened front face;
an optical unit including an optical instrument and a base plate and freely movable into and out of an internal space of the housing through the front face of the housing, the optical instrument being fixed to the base plate; and
a positioning portion disposed on a back side of the optical unit in the internal space of the housing, the back side being defined to be a side toward which the optical unit is pulled out in a movement direction of the optical unit,
the base plate including
a first convex portion disposed on a base end face of the base plate on the back side, and
a second convex portion disposed on the base end face of the base plate,
the second convex portion being disposed at a position different from the first convex portion in a width direction of the base plate, the width direction being orthogonal to the movement direction,
the positioning portion including
a V block having a V groove shape in a horizontal cross-section at a part contacting the first convex portion, the V block contacting the first convex portion at two places, and a flat block having a flat surface shape in a horizontal cross-section at a part contacting the second convex portion, and the optical unit being positioned in the internal space of the housing through the contact between the first convex portion and the V block and the contact between the second convex portion and the flat block, wherein the second convex portion includes a second body part disposed on the base end face of the base plate, and a second pin engaged with the second body part to protrude toward the back side, the second pin has a semi-spherical surface that contacts the flat block at one place the optical apparatus further comprises a second fixing member penetrating through the flat block and screwed with the second body part to pull the second pin toward the flat block, and the second fixing member is screwed with the second body part at a position lower than the second pin in a height direction of the housing, the height direction being orthogonal to the movement direction.

* * * * *